United States Patent
Druz et al.

(10) Patent No.: US 8,157,976 B2
(45) Date of Patent: Apr. 17, 2012

(54) APPARATUS FOR CATHODIC VACUUM-ARC COATING DEPOSITION

(75) Inventors: Boris Druz, Brooklyn, NY (US); Ivan I. Aksenov, Kharkov (UA); Olexandr A. Luchaninov, Kharkov (UA); Volodymyr E. Strelnytskiy, Kharkov (UA); Volodymyr V. Vasylyev, Kharkov (UA); Isaak Zaritskiy, Copiague, NY (US); Piero Sferlazzo, Marblehead, MA (US)

(73) Assignee: Veeco Instruments, Inc., Woodbury, NY (US)

( * ) Notice: Subject to any disclaimer, the term of this patent is extended or adjusted under 35 U.S.C. 154(b) by 1294 days.

(21) Appl. No.: 11/740,592

(22) Filed: Apr. 26, 2007

(65) Prior Publication Data

US 2008/0264341 A1    Oct. 30, 2008

(51) Int. Cl.
*C23C 14/00* (2006.01)
*C23C 16/00* (2006.01)
*H01L 21/306* (2006.01)

(52) U.S. Cl. .......... 204/298.41; 156/345.49; 118/723 IR (58) Field of Classification Search ............. 204/192.38, 204/298.41; 118/723 I, 723 IR, 723 AN; 156/345.48, 345.49; 315/111.51
See application file for complete search history.

(56) References Cited

U.S. PATENT DOCUMENTS

| | | | |
|---|---|---|---|
| 4,452,686 A | 6/1984 | Axenov et al. | |
| 4,551,221 A | 11/1985 | Axenov et al. | |
| 5,279,723 A | 1/1994 | Falabella et al. | |
| 5,433,836 A | 7/1995 | Martin et al. | |
| 5,435,900 A | 7/1995 | Gorokhovsky | |
| 6,026,763 A | 2/2000 | Kim et al. | |
| 6,511,585 B1 * | 1/2003 | Shi et al. | 204/192.38 |
| 6,645,354 B1 * | 11/2003 | Gorokhovsky | 204/192.38 |
| 6,663,755 B2 | 12/2003 | Gorokhovsky | |
| 2002/0007796 A1 * | 1/2002 | Gorokhovsky | 118/723 ER |
| 2003/0122090 A1 | 7/2003 | Tsukihara et al. | |
| 2004/0103845 A1 | 6/2004 | Gorokhovsky | |
| 2004/0168637 A1 | 9/2004 | Gorokhovsky | |
| 2007/0187229 A1 * | 8/2007 | Aksenov et al. | 204/192.38 |

FOREIGN PATENT DOCUMENTS

WO    WO 2005/038857    *    4/2005

* cited by examiner

*Primary Examiner* — Luz L. Alejandro
(74) *Attorney, Agent, or Firm* — Wood, Herron & Evans, LLP (57) ABSTRACT

Apparatus for cathodic vacuum-arc coating deposition. The apparatus includes a mixing chamber, at least one input duct projecting from a first end wall of the mixing chamber, and an output duct projecting from a second end wall of the mixing chamber. Coupled with each input duct is a plasma source adapted to discharge an ion flow of a coating material into the mixing chamber, which is subsequently directed to the output duct. A first solenoidal coil disposed about a side wall of the mixing chamber creates a first magnetic field inside the mixing chamber for steering the ion flow. A second solenoidal coil is disposed adjacent to the first end wall and aligned substantially coaxially with the output duct. The second solenoidal coil creates a second magnetic field inside the mixing chamber for steering the first ion flow. The electrical currents flow through the first and second solenoidal coils in opposite solenoidal directions.

19 Claims, 10 Drawing Sheets

APPARATUS FOR CATHODIC VACUUM-ARC COATING DEPOSITION

FIELD OF THE INVENTION

The invention relates generally to apparatus for cathodic vacuum-arc coating deposition and ion plasma surface treatment.

BACKGROUND OF THE INVENTION

Cathodic vacuum-arc methods of coating deposition and surface modification are widely recognized for use in the manufacture of cutting tools, shaping tools and other tools, in mechanical engineering, and in the instrument making industry. The primary advantage of cathodic vacuum-arc methods, in comparison with other deposition methods, is that various types of coatings and surface layers may be formed, including coatings and surface layers that cannot be produced by other conventional methods.

Cathodic vacuum-arc systems generate an ion flow that is unfortunately laden or contaminated with droplets and hard fragments of the cathode material commonly referred to as macroparticles. If the macroparticles reach the substrate, the quality of the synthesized coating is degraded.

Conventional cathodic vacuum-arc cathode systems incorporate measures to suppress the flow of macroparticles from the cathode to the substrate surface under treatment. One conventional measure is to rely on a magnetic filter that cleans macroparticles from the ion flux based on spatial separation of the trajectories of charged plasma components (i.e., ions) and the trajectories of macroparticles. Another conventional measure is to place an obstacle, such as a screen, baffles, or the walls of a bent tubular plasma duct, between the substrate and the cathode to occlude direct line-of-sight paths between the cathode and the substrate. In such an obstacle-based system, ions bypass the obstacle to the output of the system and are directed to the substrate guided by electromagnetic fields. Macroparticles, which are massive and weakly charged, and neutral atoms are not responsive to magnetic and electric fields. As a result, macroparticles and neutral atoms tend to move in rectilinear trajectories and are ultimately intercepted by the obstacle. Thus, the output flow is free of macroparticles.

What is needed is a cathodic vacuum-arc deposition apparatus that improves upon the construction and operation of a conventional cathodic deposition vacuum-arc apparatus.

SUMMARY OF THE INVENTION

In accordance with an embodiment of the present invention, a cathodic vacuum-arc deposition apparatus includes a mixing chamber with a side wall, a first end wall, and a second end wall separated from the first end wall by the side wall. The first end wall, the second end wall, and side wall define a space inside the mixing chamber. A first input duct projects from the first end wall. Coupled with the first input duct is a first plasma source adapted to discharge a first ion flow of a first coating material. An output duct, which projects from the second end wall, has an open end adapted to communicate with a vacuum chamber. The mixing chamber couples the first input duct in fluid communication with the output duct. The first ion flow is directed from the first input duct through the space of the mixing chamber to the output duct. A first solenoidal coil includes a helically wound conductor circumferentially disposed about the side wall of the mixing chamber. The first solenoidal coil creates a first magnetic field inside the mixing chamber for steering the first ion flow when a first electrical current flows through the helically wound conductor of the first solenoidal coil in a first solenoidal direction relative to the open end of the output duct. A second solenoidal coil includes a helically wound conductor disposed adjacent to the first end wall and aligned substantially coaxially with the output duct. The second solenoidal coil creates a second magnetic field inside the mixing chamber for steering the first ion flow when a second electrical current flows through the helically wound conductor of the second solenoidal coil in a second solenoidal direction relative to the open end of the output duct. The second solenoidal direction being opposite to the first solenoidal direction.

In accordance with an embodiment of the present invention, a cathodic vacuum-arc deposition apparatus includes a mixing chamber including a first wall, a second wall, and a third wall connecting the first and second walls. The first, second and third walls border a space defined inside the mixing chamber. First and second input ducts project from the first wall or the second wall. A first plasma source is coupled with the first input duct and is adapted to discharge a first ion flow. A second plasma source is coupled with the second input duct and is adapted to discharge a second ion flow. An output duct projects from the second wall and communicates with a vacuum chamber. The mixing chamber couples the first and second input ducts in fluid communication with the output duct. The first and second ion flows are directed from the first and second input ducts, respectively, through the space of the mixing chamber to the output duct. A flat coil is arranged to at least partially overlap the first and second walls. A portion of the flat coil is positioned between the first and second input ducts.

BRIEF DESCRIPTION OF THE DRAWINGS

The accompanying drawings, which are incorporated in and constitute a part of this specification, illustrate embodiments of the invention and, together with a general description of the invention given above and the detailed description of the embodiments given below, serve to explain the principles of the invention.

DETAILED DESCRIPTION

The present invention provides a filtered cathodic-arc apparatus capable of generating homogenous ion flows of one or more coating materials at relatively low kinetic energy that are filtered of macroparticles. The present invention will now be described in greater detail by referring to the drawings that accompany the present application.

Figure 1:
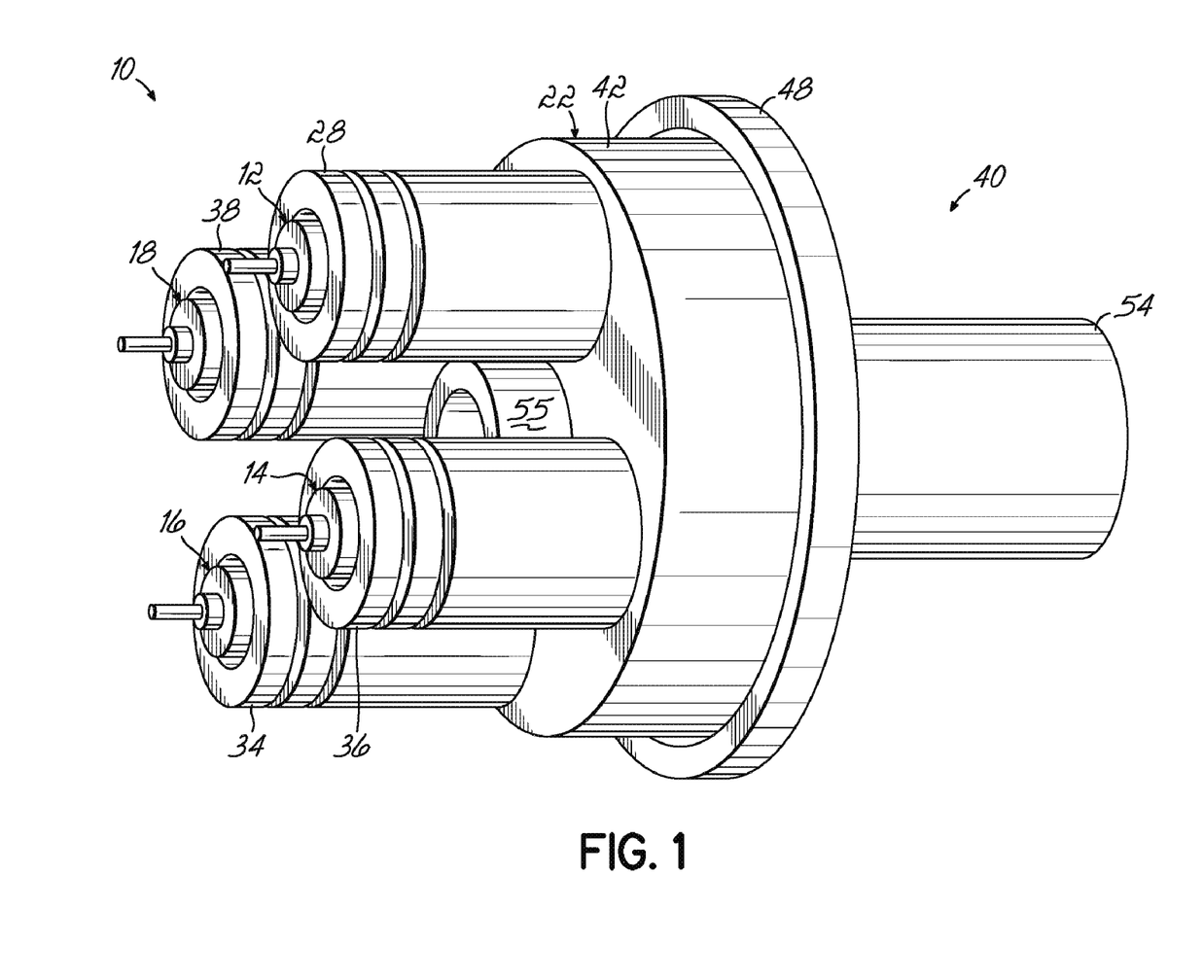
FIG. 1 is a perspective view of a filtered cathodic-arc apparatus constructed in accordance with an embodiment of the present invention.
Figure 2:
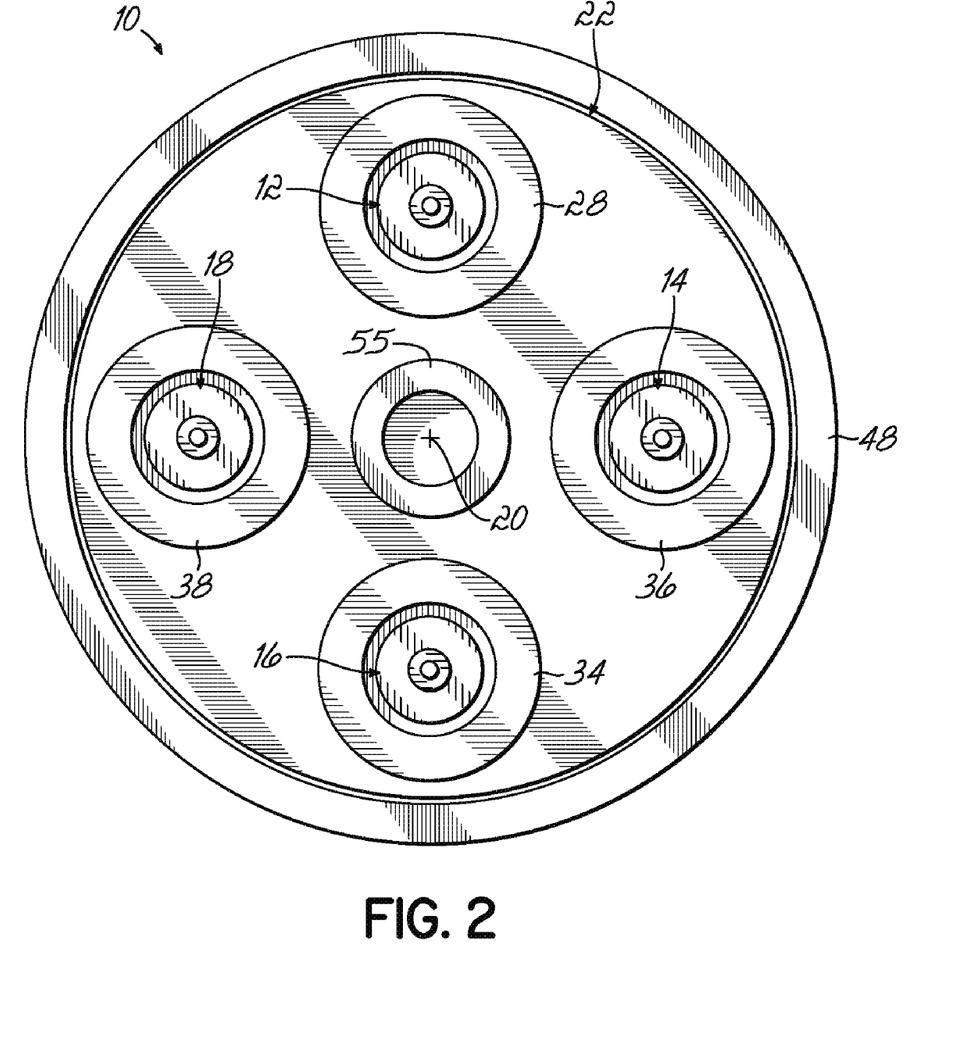
FIG. 2 is an end view of the filtered cathodic-arc apparatus of FIG. 1.
Figure 3:
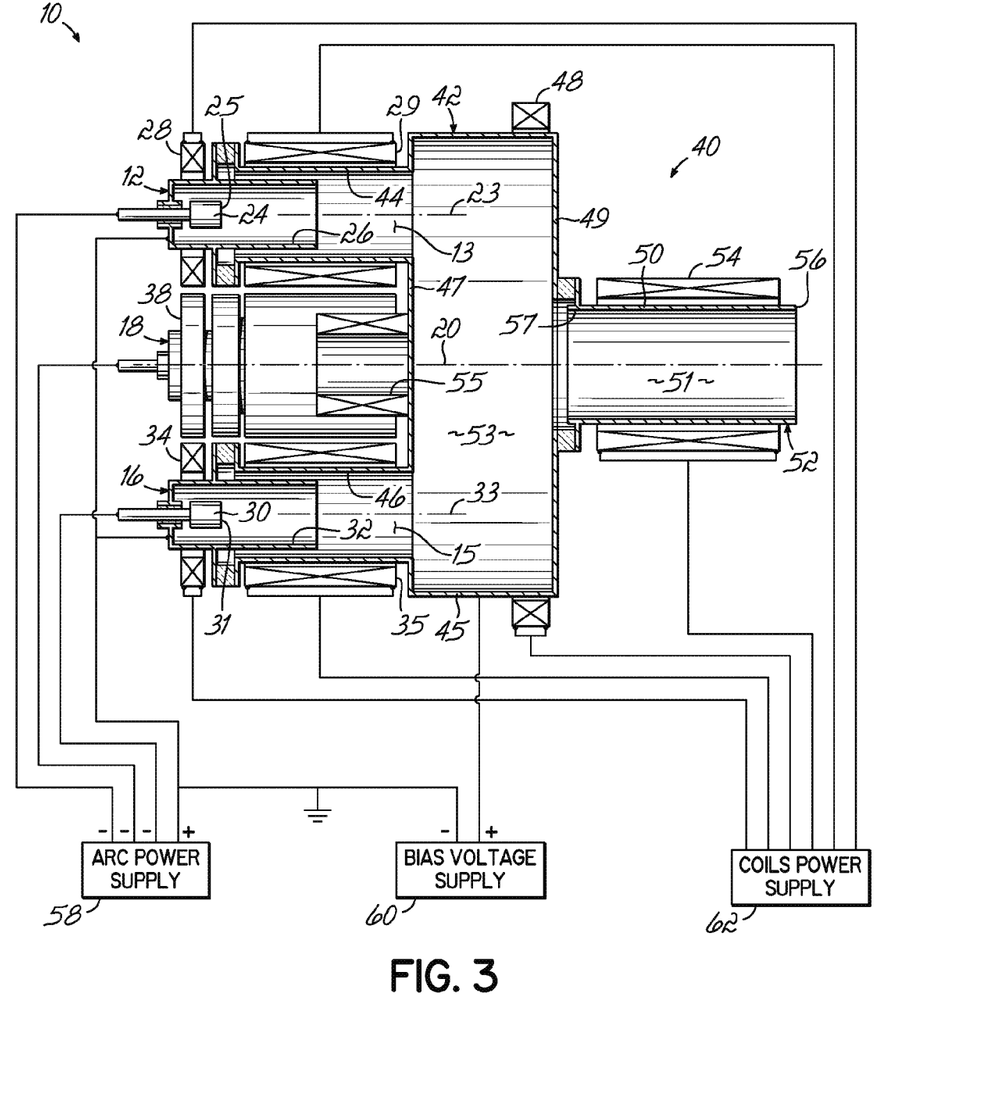
FIG. 3 is a cross-sectional view of a filtered cathodic-arc apparatus constructed in accordance with an embodiment of the present invention.

With reference to FIGS. 1-3, a filtered cathodic-arc apparatus 10 comprises a plasma filter, generally indicated by reference numeral 40, and a plurality of, for example, four individual plasma sources 12, 14, 16, 18 coupled by the plasma filter 40 with a vacuum chamber (not shown). The vacuum chamber holds substrates (not shown) to be treated by one or more ion fluxes from the filtered cathodic-arc apparatus 10. The plasma sources 12, 14, 16, 18, which are radially spaced from a central axis of symmetry or centerline 20, are circumferentially arranged about the centerline 20 and may have substantially equiangular spacings.

Plasma source 12 includes a cathode 24, an anode 26 that is arranged substantially coaxial with the cathode 24, a stabilizing solenoidal coil 28 comprising conductive windings generally encircling the cathode 24, and a focusing solenoidal coil 29 comprising conductive windings encircling the anode 26. Plasma source 16 includes a cathode 30, an anode 32 that is arranged substantially coaxial with the cathode 30, a stabilizing solenoidal coil 34 comprising conductive windings generally encircling the cathode 30, and a focusing solenoidal coil 35 comprising conductive windings encircling the anode 32. Solenoidal coil 28 generates a magnetic field shaped to stabilize the cathodic-arc discharge between the cathode 24 and anode 26. Solenoidal coil 34 generates a magnetic field shaped to stabilize the cathodic-arc discharge between the cathode 30 and anode 32.

A direct current arc power supply 58 (FIG. 3) is electrically coupled with the plasma sources 12, 14, 16, 18. The arc power supply 58 energizes the plasma sources 12, 14, 16, 18 to provide, in each instance, an arc discharge to form an unfiltered ion flux of the corresponding coating materials. For example, the cathode 24 of plasma source 12 is coupled with a negative voltage terminal of power supply 58 and the anode 26 of plasma source 12 is coupled with a positive voltage terminal of power supply 58.

Each of the cathodes 24, 30 comprises a consumable plasma-generating material, such as a metal, an alloy, or graphite. An electrical discharge is generated between cathode 24 and anode 26, when the plasma source 12 is energized by power supply 58 to an operating condition, to produce a localized cathode spot that erodes a working surface 25 of the cathode 24 and, thereby, creates an unfiltered ion flux of a coating material for extraction. An electrical discharge generated between cathode 30 and anode 32, when the plasma source 16 is energized to an operating condition, produces a localized cathode spot that erodes a working surface 31 of the cathode 30 and, thereby, creates an unfiltered ion flux of another coating material for extraction. The working gas, which may comprise a noble gas, such as argon (Ar), nitrogen ($N_2$), or mixtures of these gases, is fed into the plasma sources 12, 16 to control ion intermixing and energy thermalization. Plasma sources 14, 18 each include a cathode (not shown) that is substantially identical to cathodes 24, 30, an anode (not shown) that is substantially identical to anodes 26, 32, a respective one of solenoidal coils 36, 38 each similar to solenoidal coils 29, 35, and a respective one of solenoidal coils (not shown) each similar to solenoidal coils 29, 35. Plasma sources 14, 18, when energized to provide an operating condition, each create an unfiltered ion flux of a coating material for extraction that reflects the composition of the corresponding cathode.

Plasma filter 40 includes a mixing chamber 42, a plurality of input ducts, of which input ducts 44, 46 are representative, and an output duct 52. The mixing chamber 42 includes a generally cylindrical side wall 45 disposed between end walls 47, 49 so as to define a space 53. The side wall 45 is generally coaxial with the centerline 20. The input ducts 42, 44 are coupled with corresponding apertures of appropriate size in the end wall 47. Similarly, the output duct 52 is coupled with a corresponding aperture of appropriate size in the end wall 49.

Plasma source 12 is coupled with input duct 44, which is aligned with an axis or centerline 23, and plasma source 16 is coupled with the input duct 46, which is aligned with an axis or centerline 33. The anode 26 of plasma source 12 is arranged substantially coaxial with input duct 44 and the cathode 24 of plasma source 12 is positioned within the input duct 44 to intersect the centerline 23. The anode 32 of plasma source 16 is arranged substantially coaxial with input duct 46 and the cathode 30 of plasma source 16 is positioned within the input duct 46 to intersect the centerline 33.

The plasma filter 40 communicates ion flows of different coating materials from the plasma sources 12, 14, 16, 18 to the space 53 inside the mixing chamber 42. The net flow of coating material from plasma source 12 is directed through a space 13 bounded by the side wall of input duct 44 in a direction generally parallel to centerline 23. The net flow of coating material from plasma source 16 is directed through a space 15 bounded by the side wall of input duct 46 in a direction generally parallel to centerline 33. The spaces 13, 15 communicate with the space 53 inside the mixing chamber 42 at locations offset radially from centerline 20. The centerlines 23, 33 extend to intersect an inner surface of the walls of the mixing chamber 42, which are impacted by neutral atoms and macroparticles present in the flows of coating material generated by the plasma sources 12, 16 from the cathodes 24, 30, respectively. The same structure, characteristics, and properties apply to plasma sources 14, 18 and their operation.

The conductor of each of the focusing coils 29, 35 is helically wound about the exterior of the corresponding one of the input ducts 44, 46. The solenoidal coils 29, 35 generate magnetic fields in the input ducts 44, 46 shaped to aid in the transport of the corresponding coating material flows in spaces 13, 15 to the mixing chamber 42. A solenoidal coil 48, which comprises conductive windings that encircle the exterior of the mixing chamber 42, generates a magnetic field in space 53 that repels the positive ions in the coating material fluxes from an interior surface of the side wall 45 and end wall 49 of the mixing chamber 42 and in a direction generally toward the centerline 20.

The output duct 52, which is centrally coupled with the mixing chamber 42, may have a substantially coaxial arrangement with the centerline 20. The mixing chamber 42 couples the input ducts 44, 46 in fluid communication with the output duct 52 so that ion flows from the plasma sources 12, 16, as well as plasma sources 14, 18, are directed through space 53 to a space 51 bounded by a side wall 50 of the output duct 52. The individual ion flows are directed substantially parallel to the centerline 20 over the portion of the transport path in the space 53 inside the output duct 52. A solenoidal coil 54 supplies an electromagnetic field, when energized, in the output duct 52 that promotes the transport of the coating fluxes out of the plasma filter 40 to the environment of a vacuum chamber (not shown) in which the objects to be coated are disposed.

The side wall 50 of the tubular output duct 52 extends between opposite open ends 56, 57. Open end 56 is coupled with the vacuum chamber (not shown) and open end 57 of the tubular output duct 52 is coupled with an opening of similar diameter in the mixing chamber 42. The centerlines 23, 33 of the input ducts 44, 46 and the centerline 20 are non-linear but may be parallel as depicted in FIG. 3. The tubular output duct 52 is dimensioned with a length and inner diameter such that the open end 56 is distanced along the centerline 20 from the mixing chamber 42 such that the open end 56 is positioned beyond a line of sight from the working surfaces 25, 31 of the cathodes 24, 30, respectively.

With continued reference to FIGS. 1-3, the conductor of a solenoidal coil 55 is helically wound or wrapped about the centerline 20. Adjacent turns or windings of the helically-wound conductor in the solenoidal coil 55 are electrically isolated from each other. The solenoidal coil 55 is positioned outside of the end wall 47 of the mixing chamber 42 in a non-evacuated ambient environment surrounding the mixing chamber 42. When an electrical current flows through the conductive windings of the solenoidal coil 55, a magnetic field is created that includes field lines disposed in the space 53 inside the mixing chamber 42. The direction of the magnetic field generated by the solenoidal coil 55 in space 53 is determined by the solenoidal direction of the electrical current flowing though the conductive windings of the helically-wound conductor. The conductive windings of the solenoidal coils 54 and 55, as well as solenoidal coil 48, may be arranged coaxial with centerline 20.

A direct current power supply 62 (FIG. 3) is electrically coupled with the solenoidal coils 28, 29, 34, 35, 36, 38, 54, 55, which are understood to each include a helically-wound conductor in which adjacent turns or windings of the helical conductor are electrically isolated from each other. The magnetic fields generated by the solenoidal coils 28, 29, 34, 35, 36, 38, 54, 55 are relatively strong in the conductor-surrounded volume and relatively weak outside of this volume. The magnetic field strength is proportional to the number of conductor turns per unit length and the current through the helically-arranged conductive windings. The helically-wound conductor may be a length of copper or aluminum wire, which is covered with a thin insulation coating to prevent short circuits between adjacent turns and short circuits with any surrounding conductive structures.

An electrical current flowing through the conductive windings of solenoidal coils 28, 29 generate corresponding magnetic fields inside the input duct 44 and the conductive windings of solenoidal coils 34, 35 generate corresponding magnetic fields inside the input duct 46. Electrical current flowing through the conductive windings of solenoidal coil 36, 38 of plasma sources 12, 16 and the conductive windings of the solenoidal coils (not shown) of plasma sources 14, 18 corresponding to solenoidal coil 36, 38 generates a magnetic field inside the space 53 of mixing chamber 42. An electrical current flowing through the conductive windings of solenoidal coil 54 generates a magnetic field inside the space 51 of output duct 52. An electrical current flowing through the conductive windings of solenoidal coil 55 also generates a magnetic field inside the space 53 of mixing chamber 42 near the end wall 47. This magnetic field may be symmetrical about the centerline 20. The direction of each of the corresponding magnetic fields inside the input ducts 44, 46, mixing chamber 42, and the output duct 52 is determined by the solenoidal direction of the electrical current through the respective conductive windings of solenoidal coils 28, 29, 34, 35, 36, 38, 54, 55. The magnetic fields in the input ducts 44, 46 may be symmetrical about the corresponding one of the centerlines 23, 33. Similarly, the magnetic fields inside the mixing chamber 42 and the output duct 52 may be symmetrical about the centerline 20.

When coupled with the power supply 62 and energized, the respective electrical currents in the conductive windings of solenoidal coils 28, 29, 34, 35, 36, 38, 54 flow in one solenoidal direction to generate corresponding magnetic fields and the electrical current in the windings of solenoidal coil 55 flows in the opposite solenoidal direction to also generate a magnetic field. The orientation or direction of the vector magnetic field in the space enclosed by the current-carrying, helical conductor is given by the well known right hand rule, whereby if the fingers of a human right hand are curled inward towards the palm and pointed in the direction of the helical current flow in the conductive windings of a corresponding one of the solenoidal coils 28, 29, 34, 35, 36, 38, 54, 55, then the direction of the magnetic field is the same as that of the thumb when extended parallel to the axis about which the fingers are curled. In particular, when the right hand rule is applied for solenoid coils 28, 29, 34, 35, 36, 38, 54 with current flow in one solenoidal direction and solenoidal coil 55 with current flow in the opposite solenoidal direction, the resulting magnetic fields point in opposite directions relative to the open end 56 of the tubular output duct 52. Because of its solenoidal direction of current flow, the electromagnetic field of coil 55, when powered by power supply 62, creates a magnetic mirror that reflects a significant portion of the plasma from the interior surface of the end wall 47 of the mixing chamber 42.

A direct current bias voltage supply 60 (FIG. 3) is electrically coupled with the mixing chamber 42, the input ducts 44, 46, and the output duct 52. Bias voltage supply 60 applies a positive bias potential between the mixing chamber 42 and the input ducts 44, 46 and a positive bias potential between the mixing chamber 42 and the output duct 52. These positive bias potentials, which bias the plasma filter 40 with respect to the object to be coated in the vacuum chamber, are advantageous for controlling ion current at the open end 56 of output duct 52.

In use and with continued reference to FIGS. 1, 2, and 3, plasma filter 40, as well as the vacuum chamber to which the filtered cathodic-arc apparatus 10 is coupled, are evacuated to a working pressure in a range from $10^{-4}$ Pa to 10 Pa. Arc discharges are generated by powering the plasma sources 12, 14, 16, 18 with electrical energy from the power supply 58. It is understood that one or more of the plasma sources 12, 14, 16, 18 may be simultaneously energized for providing individual flows of different coating materials to form multilayer coatings. Coating material is eroded from the cathodes of the plasma sources 12, 14, 16, 18, such as cathodes 24, 30 of sources 12, 16, respectively. Included in the eroded coating material are electrons, positive ions, neutrals, and larger macroparticles in the form of droplets or hard fragments of cathode material.

The magnetic field lines of the electromagnetic fields from solenoidal coils 28, 29, 34, 35, 36, 38, 54, 55, which are energized by power supplied from power supply 62, guide the positive ions of the coating material through the mixing chamber 42 and to the open end 56 of output duct 52. However, the uncharged neutrals, which are not deflected or steered by the magnetic field lines, and the considerably more massive macroparticles, which are too massive to experience significant deflection by the magnetic field lines, collide with the walls of the anodes 26, 30, input ducts 44, 46, mixing chamber 42, or output duct 52. Thus, the neutrals and macroparticles fail to reach the open end 56 of output duct 52 and are removed from the coating material flux supplied to the vacuum chamber for coating the objects in the vacuum chamber.

Figure 4:
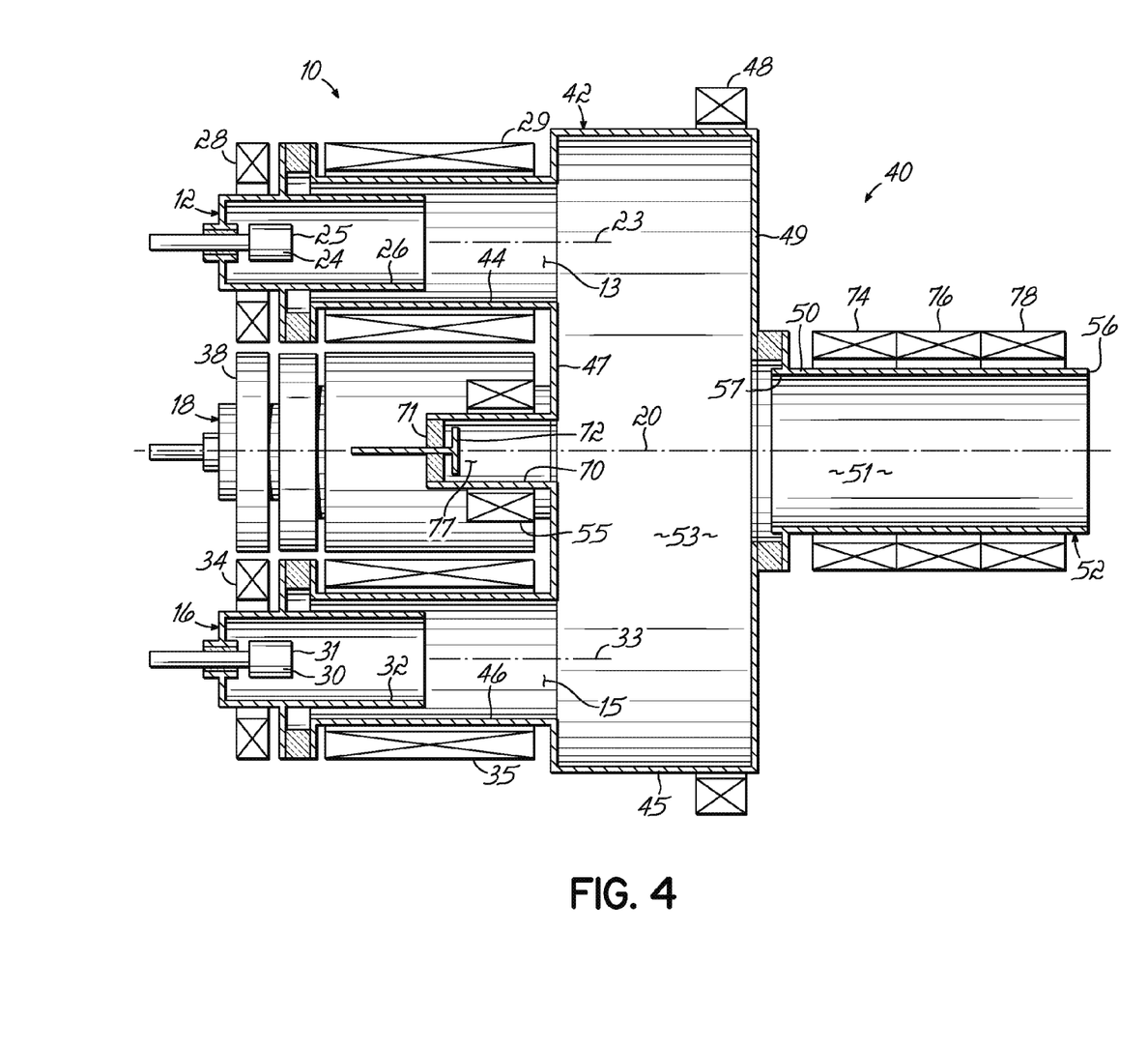
FIG. 4 is a cross-sectional view similar to FIG. 3 of a filtered cathodic-arc apparatus constructed in accordance with an alternative embodiment of the present invention.

With reference to FIG. 4 in which like reference numerals refer to like features in FIGS. 1, 2, and 3 and in accordance with an alternative embodiment of the present invention, the mixing chamber 42 includes an antechamber 70 that represents an extension that projects from the mixing chamber 42 on the same side as the input ducts 44, 46 and on the opposite side of the mixing chamber 42 from the output duct 52. The antechamber 70 is generally aligned along the centerline 20 with the output duct 52 of plasma filter 40 and separated from the output duct 52 by the mixing chamber 42. The antechamber 70 encloses a space 77 that communicates with the space 53 enclosed by the mixing chamber 42. Space 77 is considerably smaller volumetrically than space 53.

The conductive windings of solenoidal coil 55 are wound circumferentially about the exterior surface of the antechamber 70. Positioned in the antechamber 70 is a screen or electrode 72, which is electrically insulated from the antechamber 70 by an insulating feedthrough 71. The antechamber 70 spaces the electrode 72 from the space 53 inside the mixing chamber 42 so that plasma flow is not hindered.

The output duct 52 is encircled by a plurality of solenoidal coils 74, 76, 78 that replace the single solenoidal coil 54 (FIGS. 1-3). Each of the solenoidal coils 74, 76, 78 includes a helically-wound conductor in which adjacent turns or windings are electrically isolated from each other. An electrical current flowing through the conductive windings of solenoidal coils 74, 76, 78 create corresponding magnetic fields inside the output duct 52. The direction of the corresponding magnetic fields in the output duct 52 is determined by the solenoidal direction of the electrical current through the respective conductive windings of solenoidal coils 74, 76, 78.

The utilization of multiple solenoidal coils 74, 76, 78, each of which may be independently energized by power supplied from power supply 62 or by another distinct power supply (not shown), permits the magnetic field strength inside the output duct 52 to be fine tuned by adjusting the level of the current flowing in each of the coils 74, 76, 78. The fine tuning of the magnetic field inside the output duct 52 permits optimization of the plasma flow through the output duct 52 to the open end 56.

Figure 5:
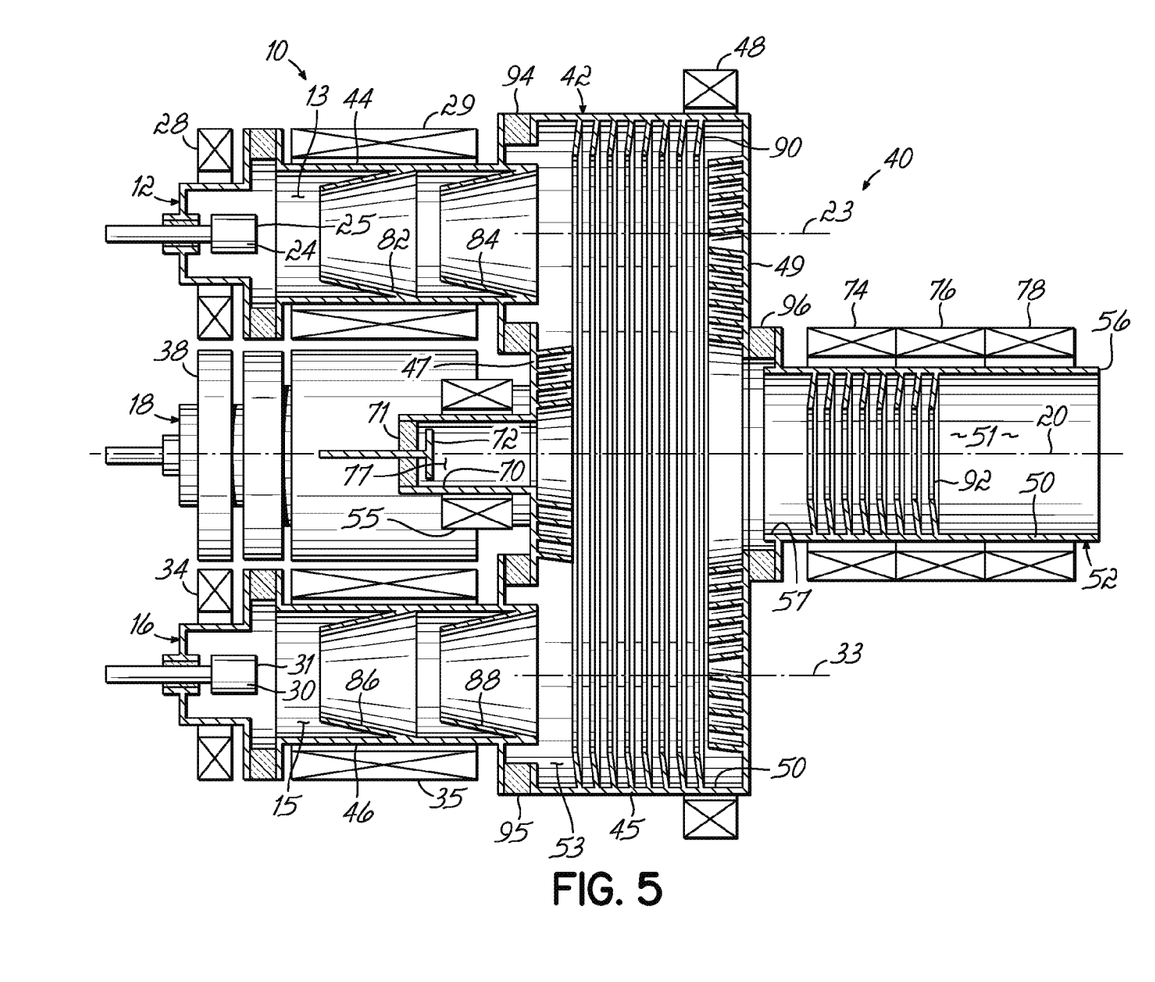
FIG. 5 is a cross-sectional view similar to FIG. 3 of a filtered cathodic-arc apparatus constructed in accordance with an alternative embodiment of the present invention.

With reference to FIG. 5 in which like reference numerals refer to like features in FIGS. 1-4 and in accordance with an alternative embodiment of the present invention, the plasma filter 40 may be provided with structures that are effective for capturing the macroparticles, which further reduces the transfer of such macroparticles to the output duct 52. Specifically, the input ducts of the plasma filter 40, of which input ducts 44, 46 coupled with plasma sources 12, 16 are representative, may include screens, such as screens 82, 84 arranged inside input duct 44 and screens 86, 88 arranged inside input duct 46. Screens 82, 84 are disposed between the cathode 24 of plasma source 12 and the mixing chamber 42. Similarly, screens 86, 88 are disposed between the cathode 30 of plasma source 16 and the mixing chamber 42. In addition to screens 82, 84, 86, 88 or instead of screens 82, 84, 86, 88, the plasma filter 40 may include baffles 90 circumferentially arranged about the interior surface of mixing chamber 42 and/or baffles 92 circumferentially arranged about the interior surface of the output duct 52. The baffles 90, 92 are located between the plasma sources 12, 14, 16, 18 and the open end 56 of the output duct 52.

Plasma source 12 is constructed with cathode 24 but, instead of anode 26 (FIGS. 1-3), the input duct 44 operates as an anode for plasma source 12. Similarly, plasma source 16 is constructed with cathode 30 but, instead of anode 32 (FIGS. 1-3), the input duct 46 operates as an anode for plasma source 16. Plasma sources 14 and 18 may have a similar construction in this embodiment of the present invention.

Ring-shaped electrical insulators 94, 95 may be provided that electrically isolate the mixing chamber 42 from the input ducts 44, 46, respectively. A ring-shaped insulator 96, which is located at the junction between the mixing chamber 42 and the output duct 52, may be provided that electrically isolates the mixing chamber 42 from the output duct 52. As a result of the electrical isolation, power may be independently supplied by the bias voltage supply 60 (FIG. 3) to the mixing chamber 42, input ducts 44, 46, and output duct 52 to provide independently controlled positive bias voltages.

Figure 6A:
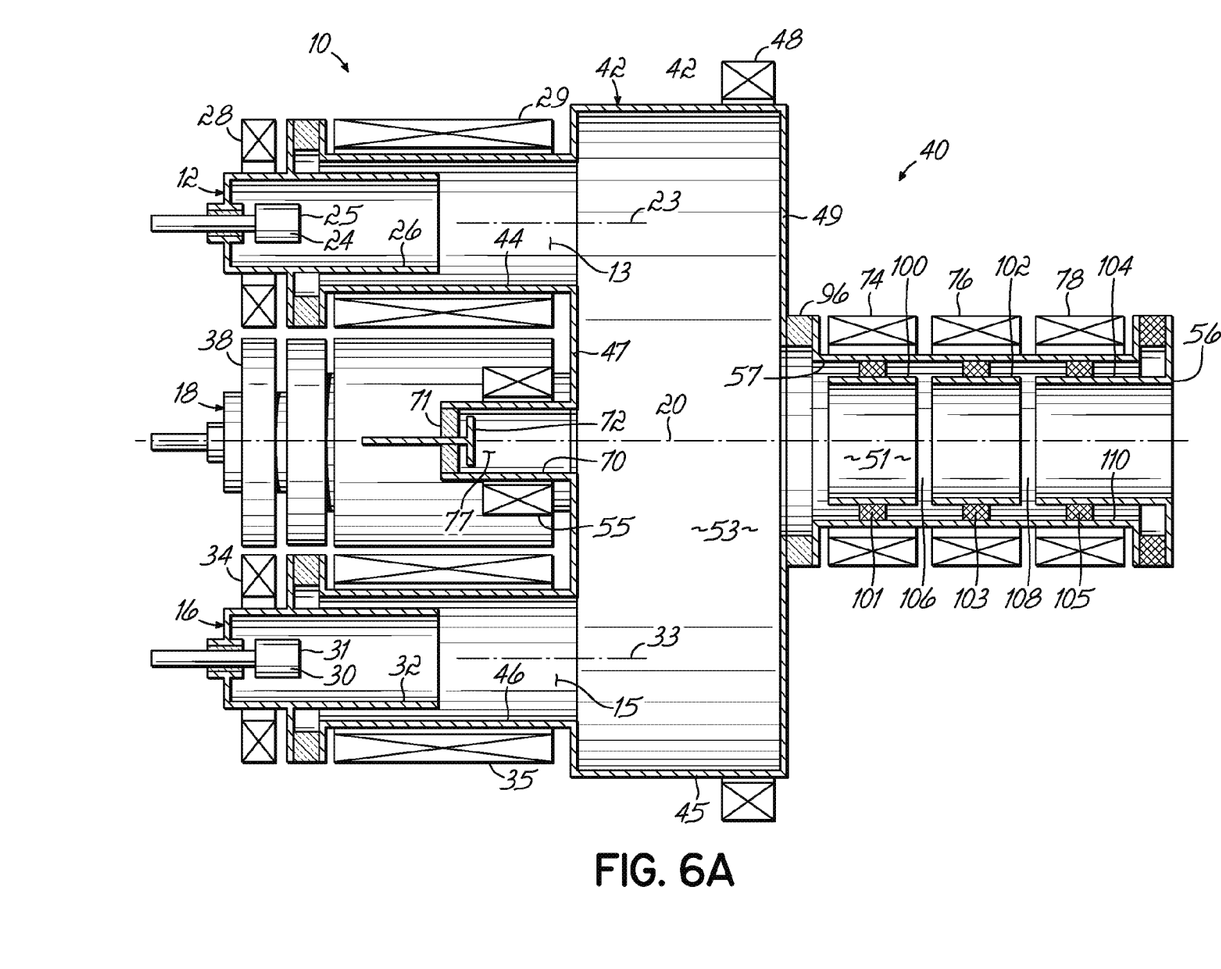
FIG. 6A is a cross-sectional view similar to FIG. 3 of a filtered cathodic-arc apparatus constructed in accordance with an alternative embodiment of the present invention.

With reference to FIG. 6A in which like reference numerals refer to like features in FIGS. 1-5 and in accordance with an alternative embodiment of the present invention, the output duct 52 of the plasma filter 40 may be partitioned into a plurality of, for example, three individual segments 100, 102, 104. Adjacent segments 100, 102, 104 are separated from each other by respective tubular or annular gaps 106, 108, which are peripherally bounded by a tubular or annular screen or electrode 110. The segments 100, 102, 104 are each electrically isolated from the electrode 110 by a corresponding one of a plurality of ring-shaped electrical standoffs 101, 103, 105.

In this embodiment of the present invention, the electrical current supplied from power supply 62 to the wound conductors of solenoidal coil 74 has the same solenoidal direction of current flow as the electrical current supplied to the wound conductors of solenoidal coils 29, 35, 48. The electrical current supplied from power supply 62 to the wound conductors of solenoidal coil 76 has the opposite solenoidal direction of current flow as the electrical current supplied to the wound conductors of solenoidal coil 74. The electrical current supplied from power supply 62 to the wound conductors of solenoidal coil 78 has the same solenoidal direction of current flow as the electrical current in the wound conductors of solenoidal coil 74 and the opposite solenoidal direction of current flow as the electrical current supplied to the wound conductors of solenoidal coil 76. Additional solenoidal coils (not shown) would be provided with the same alternating solenoidal direction among adjacent coils, which creates annular magnetic cusps in the field lines inside the output duct 52 in the vicinity of each of the annular gaps 106, 108. These annular magnetic cusps operate to reduce the energy of the positive ions of coating material being transferred through the output duct 52 from open end 57 to open end 56 and, ultimately, from the open end 56 to the attached vacuum chamber.

Electrode 110, which may be electrically insulated, operates similarly to electrode 72 (FIG. 4). Specifically, the electrode 110 is charged negatively by electrons from the plasma that escape through the annular gaps 106, 108. Once negatively charged, the negative floating potential of the electrode 110 inhibits the escape of additional electrons through the annular gaps 106, 108. This maintains overall charge neutrality in the output duct 52 by retaining negative space charge. The electrode 110 may be electrically coupled with a negative voltage power supply (not shown).

Figure 6B:
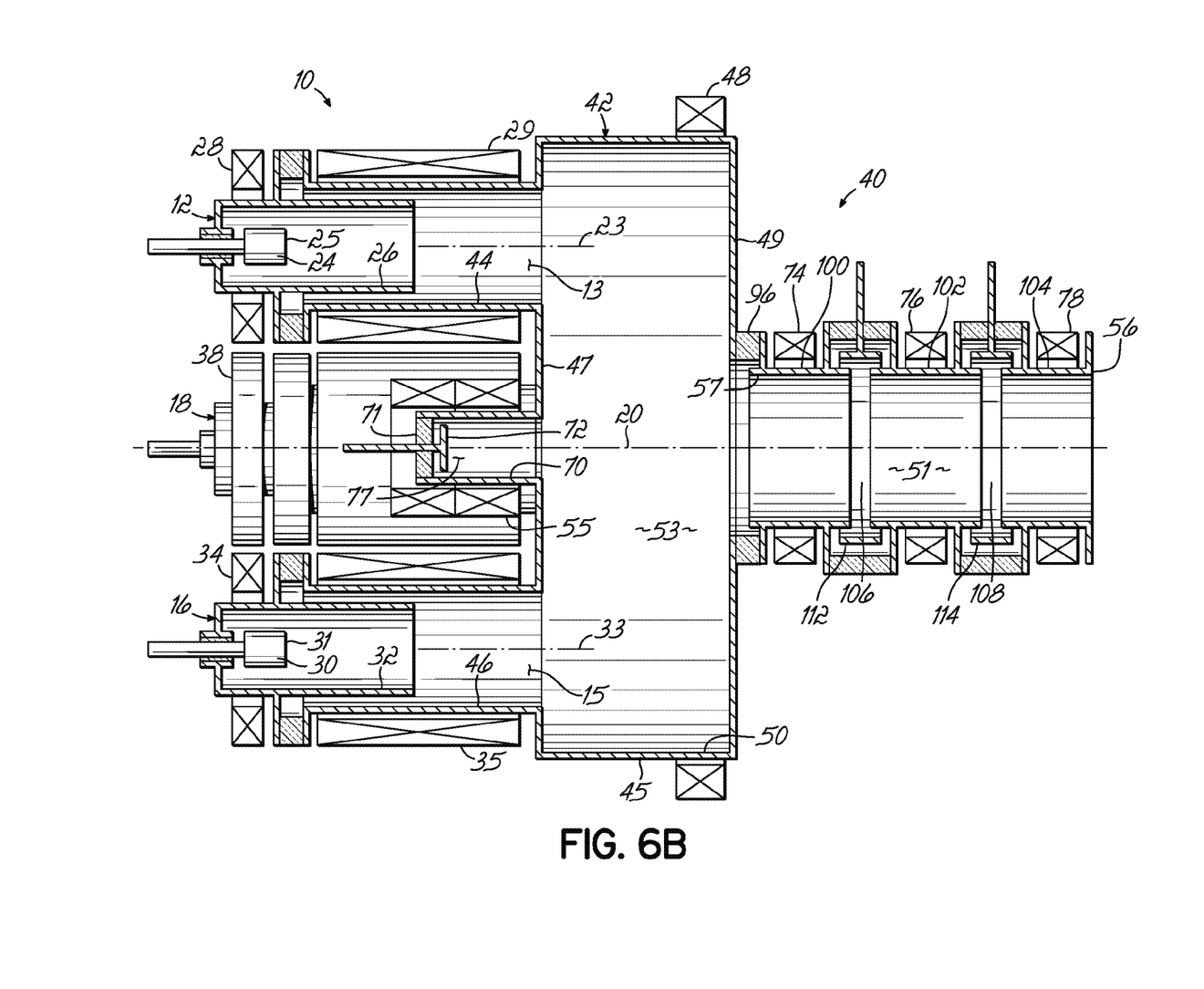
FIG. 6B is a cross-sectional view similar to FIG. 3 of a filtered cathodic-arc apparatus constructed in accordance with an alternative embodiment of the present invention.

With reference to FIG. 6B in which like reference numerals refer to like features in FIGS. 1-5 and 6A and in accordance with an alternative embodiment of the present invention, electrode 110 (FIG. 6A) may be replaced with individual tubular or annular screens or electrodes 112, 114 that are situated about the annular gaps 106, 108. The electrodes 112, 114 may be self-biased by electrons from the plasma to provide a negative floating potential or may be powered by a negative voltage power supply (not shown). Positive bias voltages applied to segments 100, 102, 104 of the output duct 52 may be matched with negative bias voltages applied to electrodes 112, 114 for adjusting the electrostatic field distribution inside the output duct 52 so as to reduce plasma losses to the surrounding walls of the output duct 52. The solenoidal coil 55 (FIGS. 1-3) is divided into two segments 55a, 55b so that the electrical current through each segment may be independently adjusted for adjusting the magnetic field inside the antechamber 70.

Figure 7:
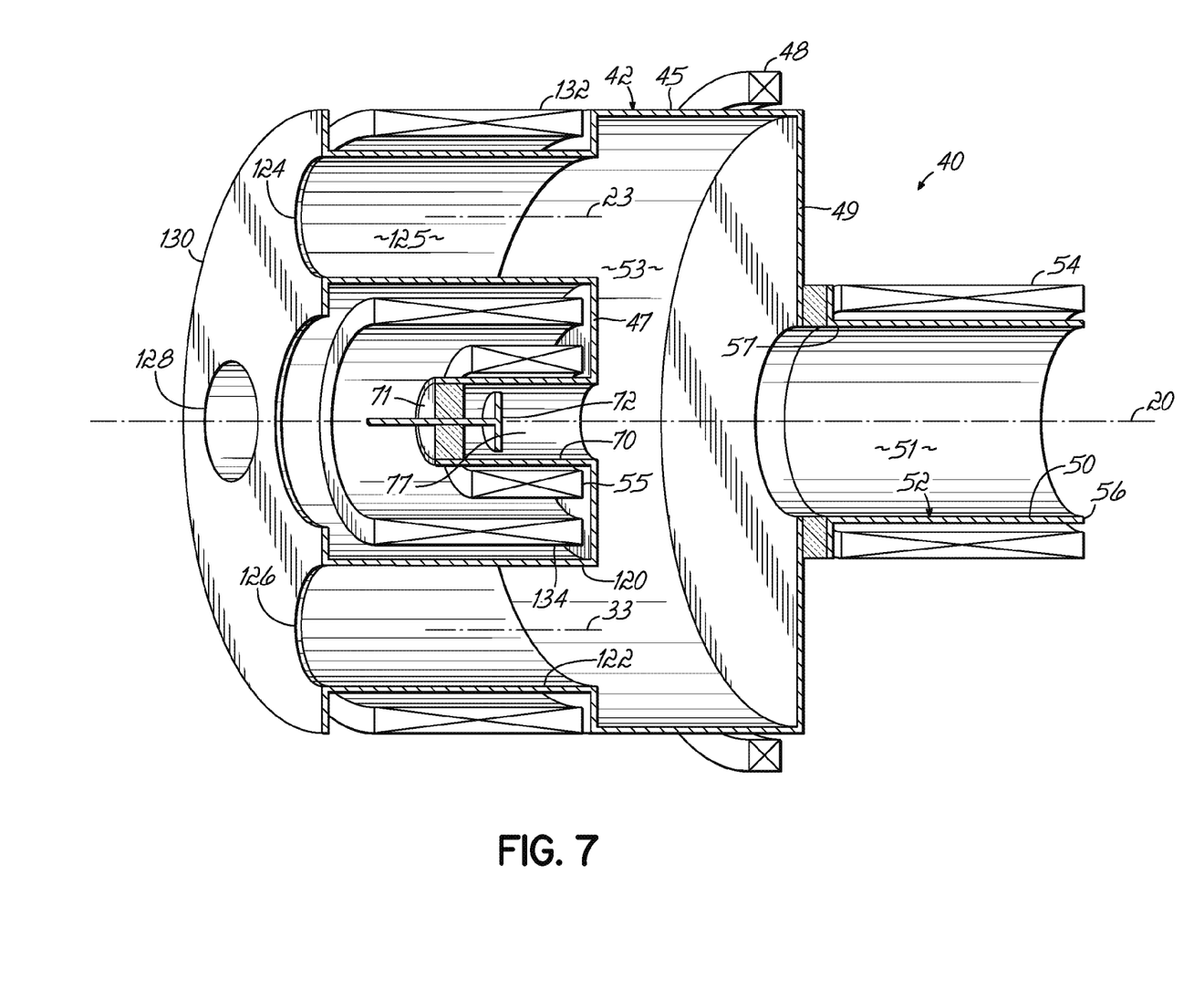
FIG. 7 is a diagrammatic cross-sectional view of a filtered cathodic-arc apparatus constructed in accordance with an alternative embodiment of the present invention.

With reference to FIG. 7 in which like reference numerals refer to like features in FIGS. 1-5, 6A, and 6B and in accordance with an alternative embodiment of the present invention, the plasma filter 40 of the filtered cathodic-arc apparatus 10 may be provided with a common input duct defined by inner and outer coaxial tubular bodies 120, 122. Communicating with an annular space 125 defined between the tubular bodies 120, 122 is a plurality of ports, of which ports 124, 126, 128 are representative, that penetrate through an annular end wall 130 that extends between the tubular bodies 120, 122. Plasma sources 12, 16, 18 (FIGS. 1-3) are coupled with ports 124, 126, 128, respectively, and plasma source 14 (FIGS. 1-3) is coupled with another port (not shown) similar to ports 124, 126, 128. The annular space 125 communicates with the space 53 inside the mixing chamber 42 in a manner functionally similar to the spaces 13, 15 inside the input ducts 44, 46 (FIGS. 1-3).

Solenoidal coil 132, which is annular, is circumferentially disposed about the exterior of tubular body 122. Solenoidal coil 134, which is tubular or annular, is circumferentially disposed about the interior of tubular body 120. These solenoidal coils 132, 134 are electrically coupled with the power supply 62 such that the solenoidal direction of the electrical current flowing in the wound conductors of coil 132 is opposite to the solenoidal direction of the electrical current flowing in the wound conductors of coil 134.

Figure 8A:
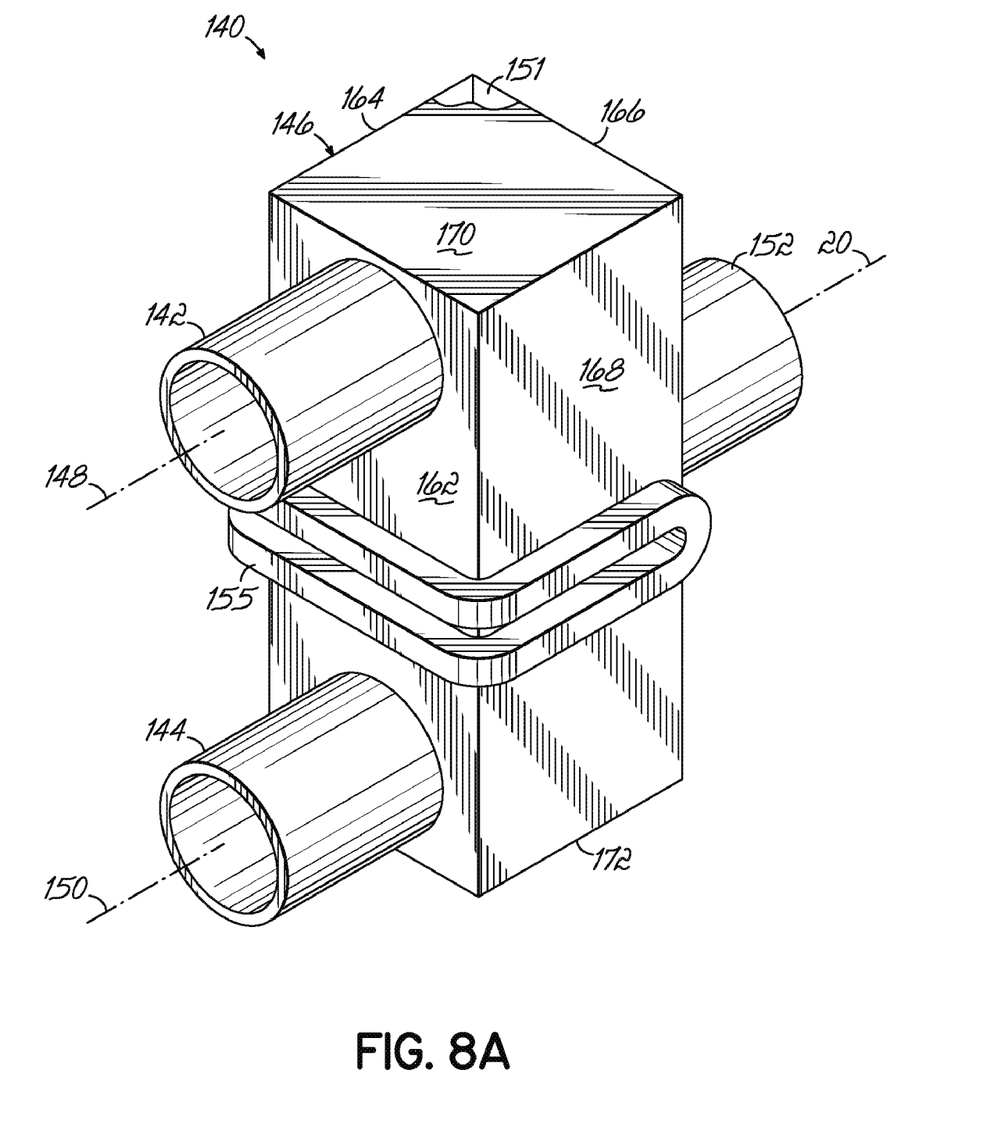
FIG. 8A is a diagrammatic perspective view of a filtered cathodic-arc apparatus constructed in accordance with an alternative embodiment of the present invention.
Figure 8B:
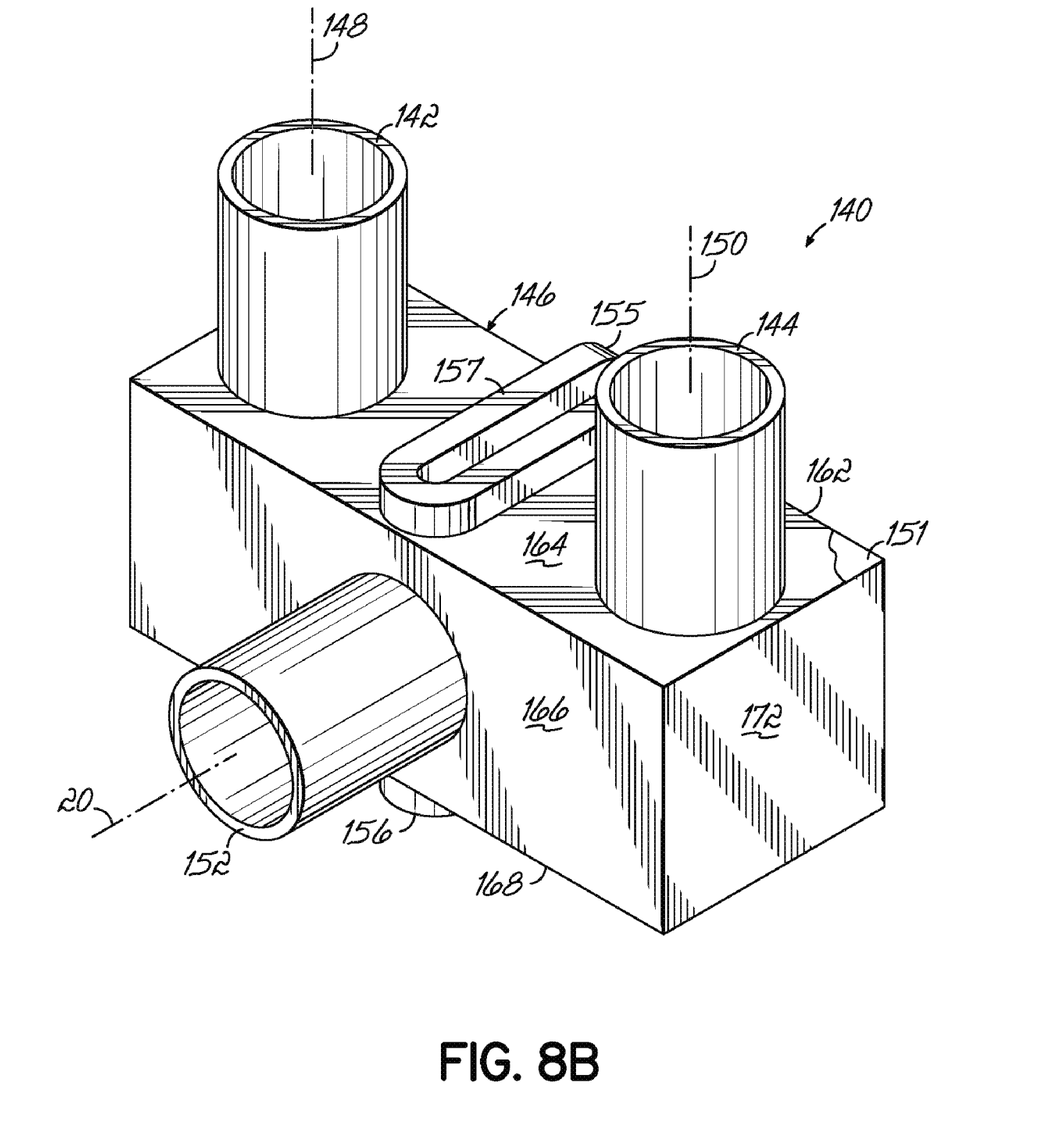
FIG. 8B is a diagrammatic perspective view of a filtered cathodic-arc apparatus constructed in accordance with an alternative embodiment of the present invention.

With reference to FIGS. 8A and 8B in which like reference numerals refer to like features in FIGS. 1-5, 6A, 6B and 7 and in accordance with an alternative embodiment of the present invention, a plasma filter 140 for a filtered cathodic-arc apparatus includes a pair of input ducts 142, 144, which are constructed similar to input ducts 44, 46 (FIGS. 1-3), and a mixing chamber 146, which is constructed similar to mixing chamber 42 (FIGS. 1-3), with which the input ducts 142, 144 communicate. Plasma sources (not shown) similar to plasma sources 12, 14, 16, 18 (FIGS. 1-3), are coupled with the input ducts 142, 144.

The mixing chamber 146 includes a plurality of side walls 162, 164, 166, 168 and a pair of end walls 170, 172 that connect the corresponding edges of the side walls 162, 164, 166, 168. The mixing chamber 146 bounds a space 151 defined inside the mixing chamber 146 for plasma flows from the input ducts 142, 144 to an output duct 152 which is constructed similar to output duct 52 (FIGS. 1-3). The input ducts 142, 144 are each coupled with the mixing chamber 146 with corresponding centerlines 148, 150 that are oriented approximately perpendicular to side wall 162 of the mixing chamber 146. The centerlines 148, 150 are approximately in the same plane as the centerline 20 extending through the output duct 152.

A flat coil 156 is wrapped about the mixing chamber 146 in a flattened horseshoe shape that is bent to conform to the shape of the exterior surface of the mixing chamber 146. The flat coil 156 is generally located in a plane that includes the centerline 20. The flat coil 156 is arranged to at least partially overlap at least two of the side walls 162, 164, 168. A portion 155 of the flat coil 156 is positioned between the input ducts 142, 144. When energized, the flat coil 156 generates a magnetic field inside the space 151 enclosed by the mixing chamber 146.

With reference to FIG. 8B in which like reference numerals refer to like features in FIGS. 1-5, 6A, 6B, 7 and 8A and in accordance with an alternative embodiment of the present invention, the input ducts 142, 144 may be repositioned in a different plane from the output duct 152. The angle between these planes may vary from 0° to 180°; however, the angle may advantageously be 90°, as shown in FIG. 8B, so as to reduce the transmission of macroparticles to the output duct 152. Another portion 157 of the flat coil 156 is positioned between the input ducts 142, 144 for this configuration of the plasma filter 140.

The apparatus of the present invention may be useful for forming high quality coatings from one, two or more metals or alloys, for forming coatings from carbon and carbon-based composites, and for forming coatings from nitride-, carbide- and oxide-type compounds. The apparatus of the present invention may be useful for surface modification of a material by exposing a substrate composed of the material to the flows of metal and gas ions/electrons. The surface modification may be promoted by electron-bombardment heating, ion etching, surface saturation with alloying agents, or plasma-immersion ion implantation. The apparatus of the present invention may be useful for combined, serial processing including surface modification and coating deposition in a single process cycle. In specific embodiments, the apparatus of the present invention may be used to deposit coatings of a high-density carbon/Si composite on magnetic heads for enhanced adhesion and corrosion resistance.

Further details and embodiments of the invention will be described in the following example.

Example 1

A filtered cathodic-arc apparatus substantially similar to the filtered cathodic-arc apparatus 10 of FIG. 5 was constructed and equipped with two plasma sources 12, 16 having water-cooled cathodes 24, 30 of titanium and aluminum that each measured 60 mm in diameter. The input ducts 44, 46, which operate as anodes for the cathodes 24, 30, were each about 300 mm long and about 190 mm in diameter. The mixing chamber 42 was about 900 mm long and about 300 mm in diameter. The output duct 52 was about 400 mm long and about 200 mm in diameter. The plasma filter 40 was formed from a non-magnetic stainless steel and water cooled. The antechamber 70 had rectangular cross-section and it was of about 30 mm in width, about 250 mm in length, and about 40 mm in depth.

The solenoidal coil 55 has a length of about 250 mm and a radial thickness of about 30 mm. The number of conductor windings in the solenoidal coils 28, 34 was about 2000 ampere-turns. The number of conductor windings in the solenoidal coils 29, 35 was about 1000 ampere-turns. The number of conductor windings in the solenoidal coils 74, 76, 78 was about 800 ampere-turns. The number of conductor windings in the solenoidal coil 48 was about 700 ampere-turns. The number of conductor windings in the solenoidal coil 55 was about 1000 ampere-turns.

The arc current to each of the plasma sources 12, 16 was about 100 Amps and the ion current of the output plasma flow from the open end 56 of output duct 52 was measured by a plane collector to be about 4.5 Amps. A multigrid electrostatic probe placed at the input to the sensor of an RF quadrapole mass analyzer was used to measure the ion energy of the output plasma flow. In particular, the kinetic energies of singly-charged and doubly-charged ions of titanium and aluminum were measured.

|  | Ions | | | |
| --- | --- | --- | --- | --- |
|  | $Ti^+$ | $Ti^{2+}$ | $Al^+$ | $Al^{2+}$ |
| Avg. Ion Energy/Ion Charge | $10 \pm 3$ eV | $7 \pm 2$ eV | $8 \pm 2$ eV | $5 \pm 1$ eV |

Example 2

Using the exemplary filtered cathodic-arc apparatus of Example 1, an ion energy was also measured for carbon by replacing the aluminum cathode with a carbon cathode. The average ion energy for $C^+$ ions was measured by the RF quadrapole mass analyzer to be $4 \pm 1$ eV.

Example 3

Using the exemplary filtered cathodic-arc apparatus of Example 1, a distribution of the ion flow densities for aluminum and titanium were measured adjacent to the open end 56 of the output duct 52 by directing the ion flow to a flat steel substrate having a diameter of 200 mm. The steel substrate was placed at a distance of about 20 mm from the open end 56. By alternating the operation of plasma sources 12, 16, the thickness of the deposited aluminum and titanium coatings on the steel substrate were measured. The measured thickness variations were in the range of 5% to 10%, which indicates that each of the types of coating ions were individually transported through the plasma filter 40 with a high spatial homogeneity.

The plasma sources 12, 16 were operated simultaneously with a working gas consisting of a mixture of nitrogen and argon at a working pressure of $4 \times 10^{-1}$ Pa in the mixing chamber 42 and input ducts 44, 46. Over a duration of two hours, a steel substrate was exposed to the combined plasma flows from the plasma sources 12, 16. A coating having a thickness of $8 \pm 0.5$ μm and comprising an alloy of titanium and aluminum was formed across the surface of the steel substrate. The microhardness of the coating was determined to be $21 \pm 3$ GPa. The small variation in the microhardness, which was within the accuracy of the measurements, indicates that the alloyed coating was formed with a high level of uniformity in the two different ion flows across the surface of the steel substrate.

While the present invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. Thus, the invention in its broader aspects is therefore not limited to the specific details, representative apparatus and method, and illustrative example shown and described. Accordingly, departures may be made from such details without departing from the spirit or scope of applicants' general inventive concept.

What is claimed is:

1. An apparatus for use with a vacuum chamber, comprising:
   a mixing chamber including a side wall, a first end wall, and a second end wall separated from said first end wall by said side wall, said first end wall, said second end wall, and said side wall defining a space inside said mixing chamber;
   a first input duct projecting from said first end wall;
   a first plasma source coupled with said first input duct, said first plasma source adapted to discharge a first ion flow of a first coating material;
   an output duct projecting from said second end wall and having an open end adapted to communicate with the vacuum chamber, said mixing chamber coupling said first input duct in fluid communication with said output duct, and said first ion flow being directed from said first input duct through said space of said mixing chamber to said output duct;
   a first solenoidal coil including a helically wound conductor circumferentially disposed about said side wall of said mixing chamber, said first solenoidal coil creating a first magnetic field inside said mixing chamber for steering said first ion flow when a first electrical current flows through said helically wound conductor of said first solenoidal coil in a first solenoidal direction relative to said open end of said output duct; and
   a second solenoidal coil including a helically wound conductor disposed adjacent to said first end wall and aligned substantially coaxially with said output duct, said second solenoidal coil creating a second magnetic field inside said mixing chamber for steering said first ion flow when a second electrical current flows through said helically wound conductor of said second solenoidal coil in a second solenoidal direction relative to said open end of said output duct, the second solenoidal direction being opposite to said first solenoidal direction,
   wherein said output duct is centered about an axis, and said helically wound conductor of said first solenoidal coil is coaxially arranged with said axis.

2. The apparatus of claim 1 wherein said helically wound conductor of said second solenoidal coil is coaxial with an axis of symmetry extending through said output duct.

3. The apparatus of claim 1 further comprising:
   a second input duct projecting from said first end wall, said first and second input ducts are each displaced from said axis of symmetry; and
   a second plasma source coupled with said second input duct, said second plasma source adapted to discharge a second ion flow of a second coating material directed from said second input duct through said space of said mixing chamber to said output duct.

4. The apparatus of claim 1 wherein said first input duct comprises first and second tubular members concentrically arranged to define an annular space aligned substantially coaxially with said output duct.

5. The apparatus of claim 1 further comprising:
   an antechamber communicating with said mixing chamber, said antechamber projecting from said first end wall, and said antechamber bounding another space communicating with said space of said mixing chamber.

6. The apparatus of claim 5 wherein said antechamber is coaxially arranged with said axis of said output duct.

7. The apparatus of claim 5 further comprising:
   a powered electrode disposed inside said antechamber at a location spaced from said first end wall.

8. The apparatus of claim 1 wherein said first plasma source includes a cathode, and said first input duct operates as a tubular anode surrounding said cathode.

9. The apparatus of claim 1 wherein said mixing chamber is electrically isolated from said first input duct, and said mixing chamber is electrically isolated from said output duct.

10. The apparatus of claim 1 further comprising:
a third solenoidal coil including a helically wound conductor circumferentially disposed about said output duct, said third solenoidal coil creating a third magnetic field inside said output duct when a third electrical current flows through said helically wound conductor of said third solenoidal coil in said first solenoidal direction relative to said open end of said output duct.

11. The apparatus of claim 1 further comprising:
a first plurality of conductive windings arranged circumferentially about said output duct creating a third magnetic field inside said output duct when a third electrical current flow through said plurality of conductive windings in said first solenoidal direction, and a second plurality of conductive windings arranged circumferentially about said output duct creating a fourth magnetic field inside said output duct when a fourth electrical current flow through said plurality of conductive windings in at least one of the first and second solenoidal directions.

12. The apparatus of claim 11 wherein said first plurality of conductive windings and said second plurality of conductive windings have a juxtaposed arrangement to create adjacent third and fourth magnetic fields inside said output duct when said third electrical current flows through said first plurality of conductive windings and said fourth electrical current flows through said second plurality of conductive windings in said second solenoidal direction.

13. The apparatus of claim 11 further comprising:
a third plurality of conductive windings wound circumferentially about said output duct, said second plurality of conductive windings disposed between and juxtaposed with said first plurality of conductive windings and said third plurality of conductive windings, said third plurality of conductive windings creating a fifth magnetic field inside said output duct when a fifth electrical current flows through said third plurality of conductive windings in at least one of the first solenoidal directions.

14. The apparatus of claim 13 wherein said first plurality of conductive windings and said third plurality of conductive windings are connected in series.

15. The apparatus of claim 11 wherein said first plurality of conductive windings are disposed adjacent to said mixing chamber and proximate the second end wall.

16. The apparatus of claim 11 further comprising:
a first tubular segment disposed within said output duct, adjacent to said mixing chamber and proximate the second end wall; and
a second tubular segment disposed within said output duct and juxtaposed with said first tubular segment,
wherein said first and second tubular segments are separated by a gap, said first plurality of conductive windings is disposed about said first tubular segment, and said second plurality of conductive windings is disposed about said second tubular segment.

17. The apparatus of claim 16 further comprising:
a tubular electrode positioned within said gap between said first tubular segment and said second tubular segment and configured to bridge said gap.

18. The apparatus of claim 16 further comprising:
a tubular electrode having a first portion arranged in a first annular space defined between said first tubular segment and said first plurality of conductive windings and a second portion arranged in a second annular space defined between said second tubular segment and said second plurality of conductive windings.

19. The apparatus of claim 1 wherein a center of said first input duct is radially offset with respect to said axis of said output duct.

* * * * *

UNITED STATES PATENT AND TRADEMARK OFFICE
CERTIFICATE OF CORRECTION

| | | |
|---|---|---|
| PATENT NO. | : 8,157,976 B2 | Page 1 of 1 |
| APPLICATION NO. | : 11/740592 | |
| DATED | : April 17, 2012 | |
| INVENTOR(S) | : Boris L. Druz et al. | |

It is certified that error appears in the above-identified patent and that said Letters Patent is hereby corrected as shown below:

In the Specification:

At column 7, line number 33, change "create" to --creates--.

At column 11, line number 29, change "were" to --was-- and at line number 35, change "were" to --was--.

In the Claims:

At column 13, claim number 11, line number 16, change "flow" to --flows--.

At column 13, claim number 11, line number 21, change "flow" to --flows--.

Signed and Sealed this
Thirty-first Day of July, 2012

David J. Kappos
*Director of the United States Patent and Trademark Office*